United States Patent [19]

Jung et al.

[11] Patent Number: 5,760,791
[45] Date of Patent: Jun. 2, 1998

[54] GRAPHIC RAM HAVING A DUAL PORT AND A SERIAL DATA ACCESS METHOD THEREOF

[75] Inventors: Seong-Ook Jung; Seung-Mo Seo; Dae-Je Chin, all of Seoul, Rep. of Korea

[73] Assignee: Samsung Electronics Co. Ltd., Kyungki-Co, Rep. of Korea

[21] Appl. No.: 378,277

[22] Filed: Jan. 26, 1995

[30] Foreign Application Priority Data

Jan. 26, 1994 [KR] Rep. of Korea .......... 1994/1358

[51] Int. Cl.$^6$ ................................. G09G 5/36
[52] U.S. Cl. ............... 345/509; 345/508; 395/510
[58] Field of Search ................... 345/185, 189, 345/190, 196, 198, 200, 201; 395/164, 165, 166, 507, 508, 509, 511; 348/567; 365/189.05, 205, 221, 190, 154, 207, 208

[56] References Cited

U.S. PATENT DOCUMENTS

| | | | |
|---|---|---|---|
| 4,747,081 | 5/1988 | Heilveil et al. | 365/219 |
| 4,937,781 | 6/1990 | Lee et al. | 364/900 |
| 5,343,425 | 8/1994 | Saito et al. | 365/189.01 |
| 5,367,486 | 11/1994 | Mori et al. | 365/189.05 |
| 5,519,413 | 5/1996 | Thomas et al. | 345/185 |
| 5,523,979 | 6/1996 | Nemazie | 365/230.05 |
| 5,543,824 | 8/1996 | Priem et al. | 345/201 |

*Primary Examiner*—Michael H. Lee
*Attorney, Agent, or Firm*—Cushman Darby & Cushman IP Group of Pillsbury Madison & Sutro LLP

[57] ABSTRACT

A graphic RAM array has a plurality of sub blocks which share random and serial output paths. This structure enables random access to the random output path of one RAM array while a specific sub block of another other RAM array is performing a display operation via the serial output path. The graphic RAM does not have a separate data register and outputs the serial data using only the RAM array. Thus, only the RAM array is formed in the cell core region, thereby reducing the size and price of the chip. In addition, it is possible for the graphic RAM to be compatible with a system having a conventional video RAM controller.

16 Claims, 8 Drawing Sheets

GRAPHIC RAM HAVING A DUAL PORT AND A SERIAL DATA ACCESS METHOD THEREOF

BACKGROUND OF THE INVENTION

1. Field of the Invention

The present invention relates to a graphic RAM used in a graphic system, and particularly to a display graphic RAM having a dual port memory.

2. Description of the Related Art

As is well known, a video RAM used for graphic display has a dual port. This video RAM is a dual port memory which can be used asynchronously by adding the function of a normal dynamic RAM to the function of a data register (which is also referred to as a serial access memory) capable of transferring data at a high speed. Thus, while a random port of the video RAM is performing an access operation, like read or write with the system, a serial port transfers serial data to a cathode-ray tube(CRT) regardless of the operation of the random port. An example of such a video RAM can be found in U.S. Pat. No. 4,498,155 filed Feb. 5, 1985 and entitled "SEMICONDUCTOR INTEGRATED CIRCUIT MEMORY DEVICE WITH BOTH SERIAL AND RANDOM ACCESS ARRAYS". Such a video RAM is designed to be able to connect the dynamic RAM port to a CPU and the serial port to an external system like the CRT or a video camera, which results in high system applicability and wide application.

Figure 1:
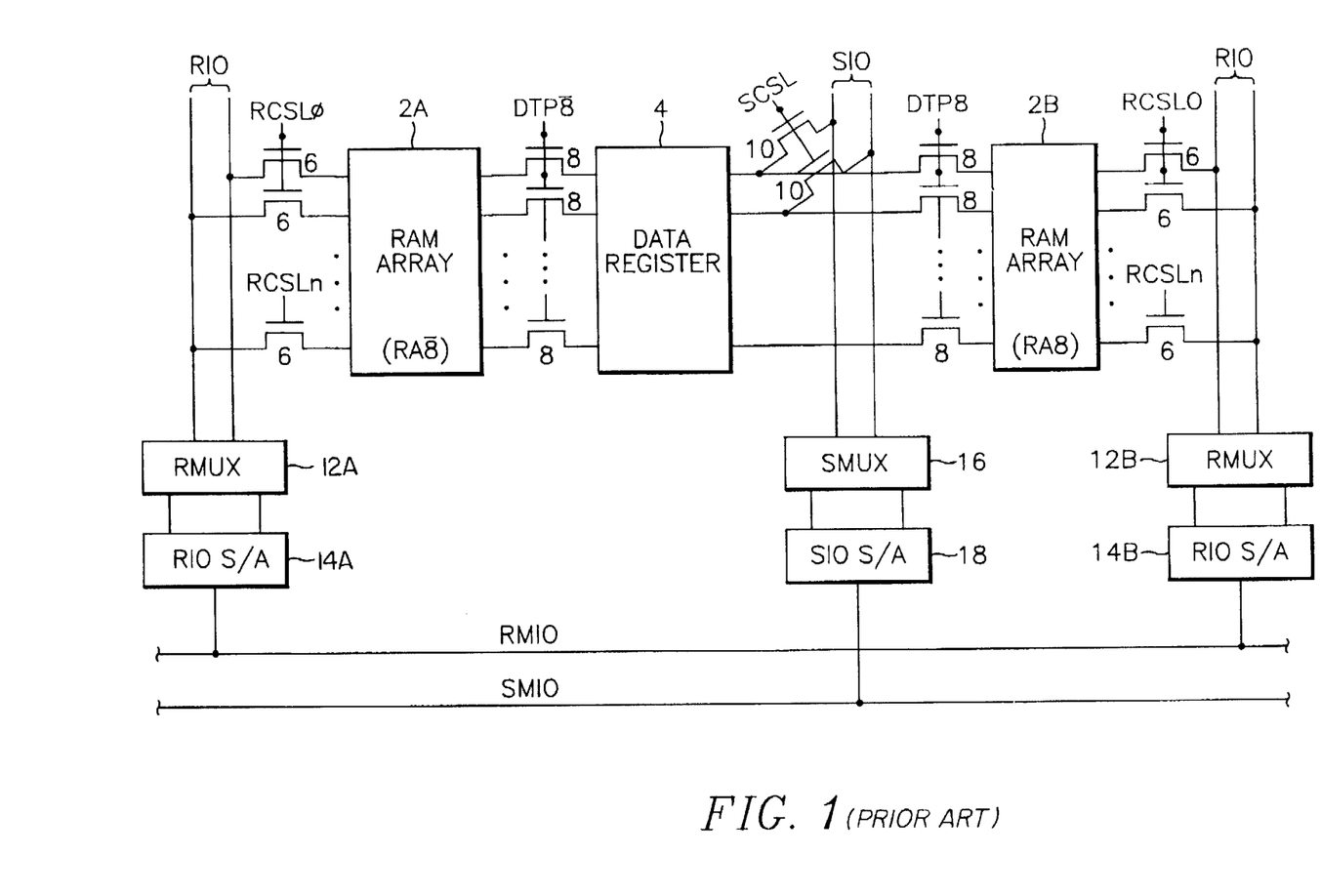
FIG. 1 is a block diagram showing an internal construction of a conventional video RAM.

FIG. 1 is a block diagram showing a part of the internal structure of a typical video RAM, particularly, the construction of the normal cell array, data register and output path thereof. FIG. 1 is constructed to select RAM arrays 2B and 2A with respective row addresses RA8 and RA $\bar{8}$ (which is to be block selection addresses), however, such a construction can be modified. As shown in FIG. 1, the video RAM further includes a data register 4 besides RAM arrays 2A and 2B having the same function as the RAM array (which is also referred to as a cell array) of the normal dynamic RAM. Typically, the data register 4 is as large as a row of the RAM array 2A or 2B. The data register 4 is formed between the RAM arrays 2A and 2B and the transfer gate 8 is connected between the data register 4 and respective RAM arrays. The transfer gate 8 is switch-controlled by data transfer enable signals DTP8 and DTP $\bar{8}$ Particular examples of the technique for transferring data from the RAM array 2A or 2B to the data register 4 are the FULL-SAM technique adopted in μPD482445, the video RAM product of NEC in Japan and the HALF-SAM technique adopted in TMS55160, the video RAM product of U.S. based Texas Instruments.

In FIG. 1, to access the data stored in the RAM array 2A or 2B to the CPU, the data is transferred to a RAM data I/O line RIO via a column gate 6 controlled by RAM column selection lines RCSL0, . . . RCSLn (n=1,2,3, . . . ). The data on the RAM data I/O line RIO is multiplexed by a RAM multiplexer RMUX 12A or 12B and is amplified by a RAM data I/O line sense amplifier RIO S/A 14A or 14B, to be transferred to a RAM main data I/O line RMIO. The data on the RMIO is output to the outside via a RAM data output buffer (not shown) and a PIN. The serial data read-out from the data register 4 is transferred to a serial data I/O line SIO via a serial column gate 10 which performs a switching operation in response to the control of a serial column selection line SCSL. The data on the SIO is multiplexed by a serial multiplexer SMUX 16 and is amplified by a serial data I/O line sense amplifier SIO S/A 18, to be transferred to a serial main data I/O line SMIO. The data on the SMIO is synchronized with a serial clock, to be output to the display device CRT.

The video RAM having the same construction as that shown in FIG. 1 also includes a data register 4 and transfer gates as compared to the normal dynamic RAM, so that the size of the chip becomes relatively large. Particularly, the data register 4 must be designed in a cell core region. The cell core region typically means the region in which only the memory cells are stored or the region including the memory cells and the bit line sense amplifier. The cell core region requires an advanced manufacturing technique and particularly minute transistors to achieve high integration of the chip. Hence, because the data register and the output path thereof are formed in the cell core region, the size of the chip becomes large, thereby increasing the price of the chip. It is well known to those skilled in the art that a video RAM chip is more expensive than a normal dynamic RAM chip.

SUMMARY OF THE INVENTION

It is therefore an object of the present invention to provide a graphic RAM which is capable of reducing the cost associate with a chip.

It is another object of the present invention to provide a graphic RAM the chip size of which is smaller than that of a video RAM.

It is another object of the present invention to provide a graphic RAM which is a dual port memory, however, the chip size of which is reduced, thus lowering the price thereof.

It is another object of the present invention to provide a graphic RAM which is the dual port memory without a data register.

It is another object of the present invention to provide a graphic RAM which is capable of accessing data to both a CPU and a display device only by using a RAM array.

It is another object of the present invention to provide a graphic RAM which is compatible with a video RAM controller of a system and has the same external construction as that of the video RAM and an internal construction without the data register, thereby reducing the price of the chip.

It is another object of the present invention to provide a method for accessing the serial data of the graphic RAM which is capable of reducing the price of the chip.

It is another object of the present invention to provide a method for accessing serial data of the graphic RAM the chip size of which is smaller than that of the video RAM.

It is another object of the present invention to provide a method for accessing the serial data of the graphic RAM which is the dual port memory, however, the chip size of which is reduced, thus lowering the price thereof.

It is another object of the present invention to provide a method for accessing the serial data of the graphic RAM which is the dual port memory without the data register.

It is still another object of the present invention to provide a method for accessing the serial data of the graphic RAM which is capable of accessing the data to respective CPU and display device only by using the RAM array.

It is yet another object of the present invention to provide a method for accessing the graphic RAM which is compatible with the video RAM controller of the system and has the same external construction as that of the video RAM and an internal construction without the data register, thereby reducing the price of the chip.

To achieve the above objects, the present invention provides a graphic RAM having a dual port.

The graphic RAM according to the present invention outputs the display data to the display device in response to the control of the system. This graphic RAM includes RAM arrays having including a plurality of sub blocks, each sharing random and serial output paths, thereby enabling random access to the random output path of one RAM array while a specific sub block of the other RAM array is performing a display operation to the display device through the serial output path. The method of using the graphic RAM according to the present invention includes the step of outputting the data of the RAM array to the display device in response to a second control of the system while the data of the RAM array is accessed by the system in response to a first control of the system.

One preferred embodiment of the graphic RAM according to the present invention includes a first RAM array having a plurality of memory cells, a second RAM array having a plurality of memory cells, a first RAM transfer for accessing the data of the first RAM array to the system, a first serial transfer for outputting the data of the first RAM array as the display data, a second RAM transfer for accessing the data of the second RAM array to the system, and a second serial transfer for outputting the data of the second RAM array as the display data, thereby selectively outputting respective data of the first and second RAM arrays to the system and display device.

The method for accessing the serial data of graphic RAM according to the present invention is the method wherein the graphic RAM has RAM arrays including a plurality of sub blocks, each sharing the random and serial output paths, thereby performing the random access to the random output path of one RAM array while the specific sub block of the other RAM array is performing the display operation to the display device through the serial output path.

BRIEF DESCRIPTION OF THE DRAWINGS

In the detailed description of the preferred embodiment of the present invention presented below, reference is made to the accompanying drawings, in which.

DETAILED DESCRIPTION OF THE PREFERRED EMBODIMENT

The term "graphic RAM" as used herein, indicates a RAM which is capable of performing a random access operation like a normal dynamic RAM and serially outputting the graphic data to a display device like a cathode-ray tube in response to the control of a system. The conventional video RAM is included in the graphic RAM.

Figure 2:
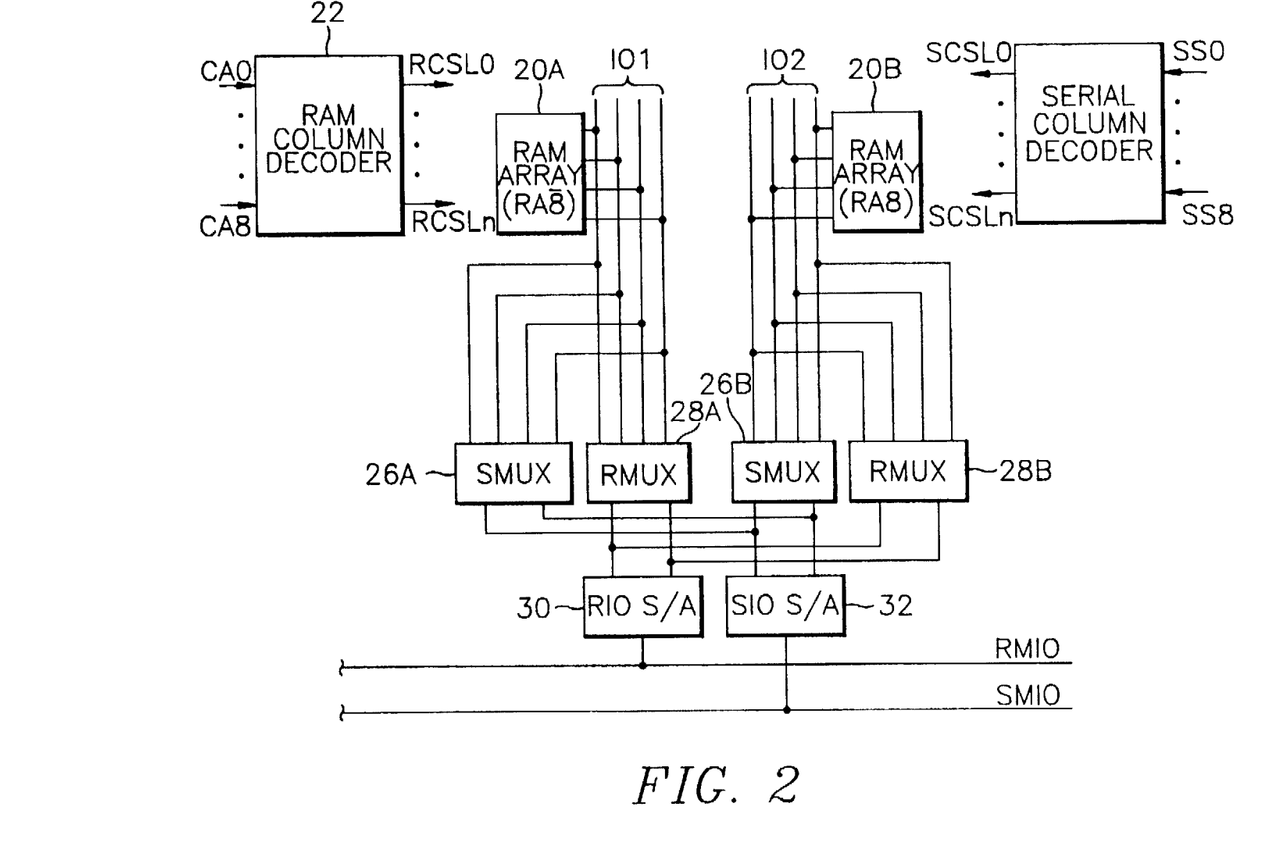
FIG. 2 is a block diagram showing an internal construction of a graphic RAM according to the present invention.

FIG. 2 is a block diagram showing a portion of the internal construction of an graphic RAM according to the present invention. FIG. 2 has a minimum construction to perform both random and serial accesses only by a RAM array and thus the capacity of the RAM array in the same construction as that of FIG. 2 is increased in proportion to the integration density. As shown in FIG. 2, the RAM arrays 20A and 20B are selected by row addresses RA8 and RA $\overline{8}$.

The RAM array of FIG. 2 includes a first RAM array 20A, a second RAM array 20B, a first common data I/O line 101 connected to the first RAM array 20A, a second common data I/O line 102 connected to the second RAM array 20B, a first RAM multiplexer 28A connected to the first common data I/O line 101, a first serial multiplexer 26A connected to the first common data I/O line 101, a second RAM multiplexer 28B connected to the second common data I/O line 102 and a second serial multiplexer 26B connected to the second common data I/O line 102.

In FIG. 2, if the first RAM array 20A accesses the data display data to the system, the second RAM array 20B outputs the display data, or if the second RAM array 20B accesses the display data to the system, the first RAM array 20A outputs the display data. As compared to FIG. 1, the construction of FIG. 2 is featured in that it does not have a data register and data transfer gates for transferring the data of the RAM array to the data register.

The conventional video RAM further includes a serial access data register for performing a serial access operation at the memory core region of the dynamic RAM, this results in considerably increasing the size of the chip, as compared to the normal dynamic RAM. Accordingly, the present invention uses the memory core region of the conventional dynamic RAM and separates the column gates and I/O data paths into the random/serial access gates and paths, thereby operating as a dual port. This makes it possible to reduce the lay-out area and the price of the chip and realize high performance.

FIG. 2 shows a part of the cell core region, however, as known in the art, the cell core region is composed of a plurality of sub blocks, each being enabled or disabled by the most significant bit MSB of the row address. FIG. 2 has two sub blocks to be selected by RA8 and RA $\overline{8}$. The graphic RAM of FIG. 2 operates as the dual port in the following manner. While the sub block selected by the row address RA $\overline{8}$ is serially read (at this time, random access to this sub block is prevented.), it is possible to perform the random access to the sub block selected by RA8 and the reverse is also possible. As a result, it is not necessary to transfer data to the data register, so that the lay-out area can be reduced.

Figure 3:
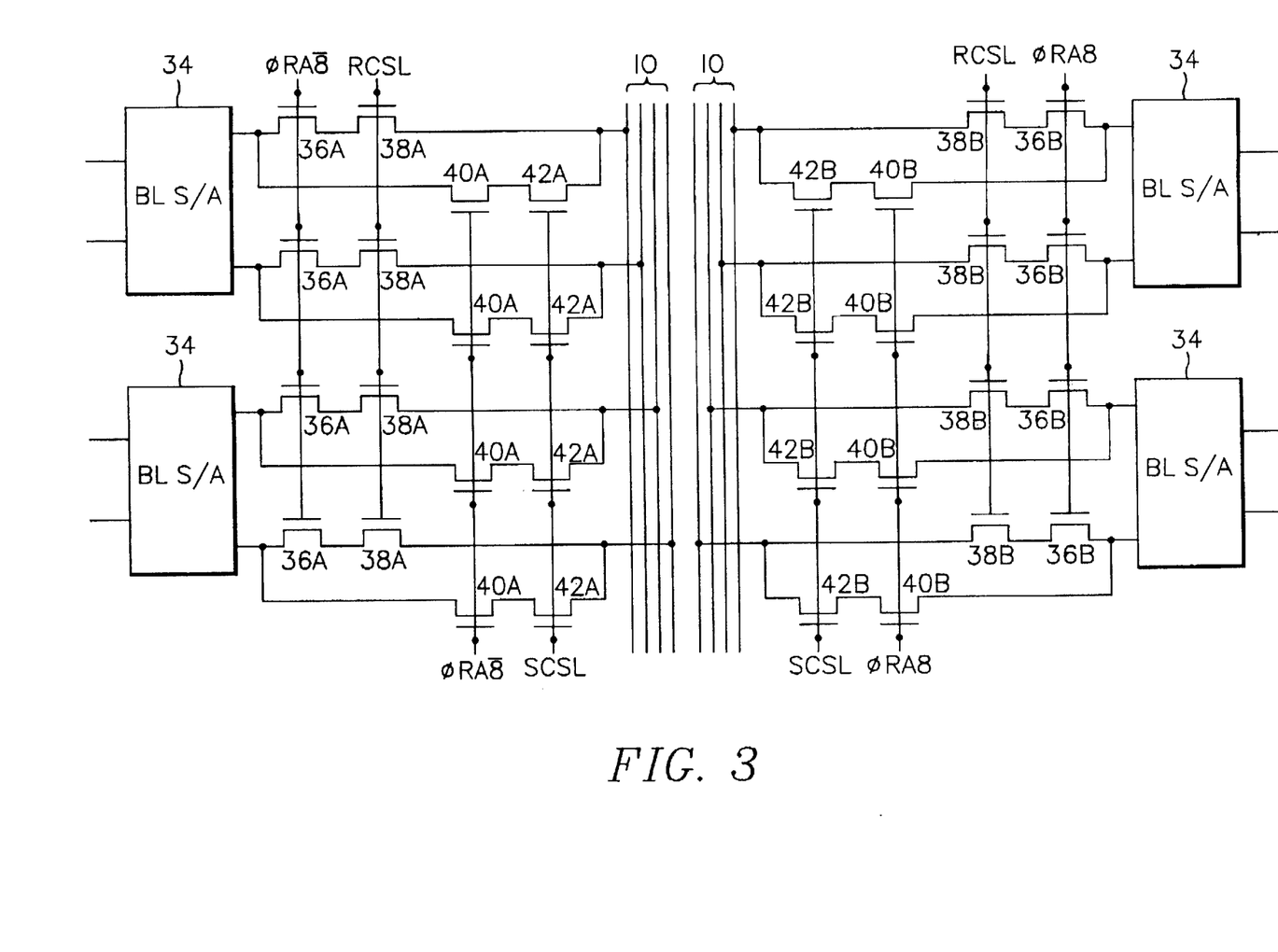
FIG. 3 is a circuit diagram showing a path for transferring RAM/serial column of FIG. 2.

FIG. 3 is a circuit diagram showing the RAM/serial column transfer paths of FIG. 2. The circuit of FIG. 3 has a word line for selecting the row of the RAM array composed of a plurality of memory cells and bit line for selecting the column of the RAM array and then transferring the data of the memory cells. The circuit of FIG. 3 includes a bit line sense amplifier 34 for amplifying the data read-out from the RAM array via the bit line, a common I/O line IO, a first path(composed of transistors 36A(or 36B) and 38A(or 38B)) formed between the bit line sense amplifier 34 and the common I/O line IO, on which a current path is formed during the random access operation, a second path (composed of transistors 40A(or 40B) and 42A(or42B)) formed between the bit line sense amplifier 34 and the common I/O line IO, on which the current path is formed during the serial access operation. The common I/O line IO is connected to the random access multiplexer 28A or 28B and to the serial access multiplexer 26A or 26B of FIG. 2.

The method for accessing data in such a construction comprises a first step of selecting the row of the RAM array composed of a plurality of memory cells by the word line, a second step of selecting the column of the RAM array with bit line and then transferring the data of the memory cell, a third step of amplifying the data read-out from the RAM array via the bit line by the bit line sense amplifier 34, a fourth step of forming a current path during the random access operation on the first path formed between the bit line sense amplifier 34 and the common I/O line IO, a fifth step of forming the current path at the serial access operation on the second path formed between the bit line sense amplifier 34 and the common I/O line IO, a sixth step of multiplexing the data transferred to the common I/O line IO via the first path by the random access multiplexer, and a seventh step of multiplexing the data transferred to the common I/O line IO via the second path by the serial access multiplexer. Through the first, second, third, fifth and seventh steps, the serial access operation is sequentially performed. The random access operation is sequentially performed through the first, second, third, fourth and sixth steps.

Figure 4A:
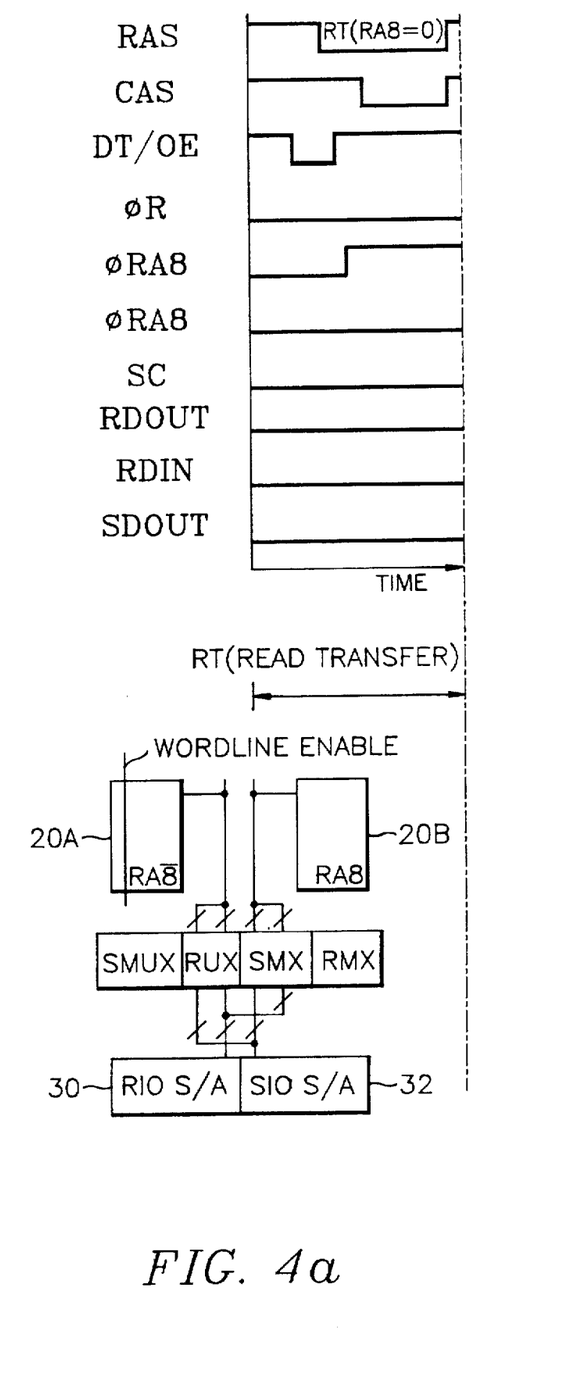
FIGS. 4A–4C a timing diagram showing an operation of the graphic RAM according to the present invention.
Figure 4B:
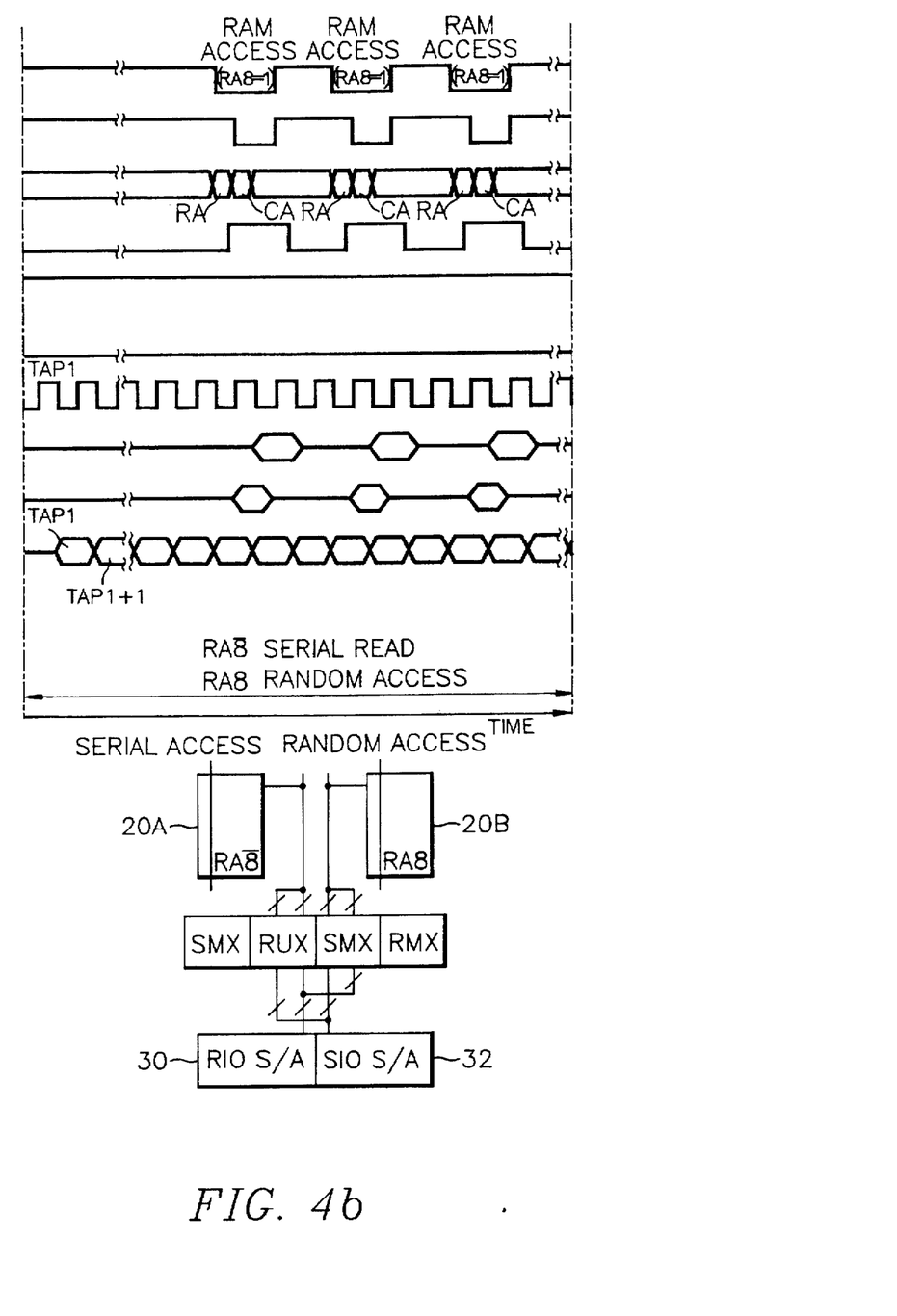
Figure 4C:
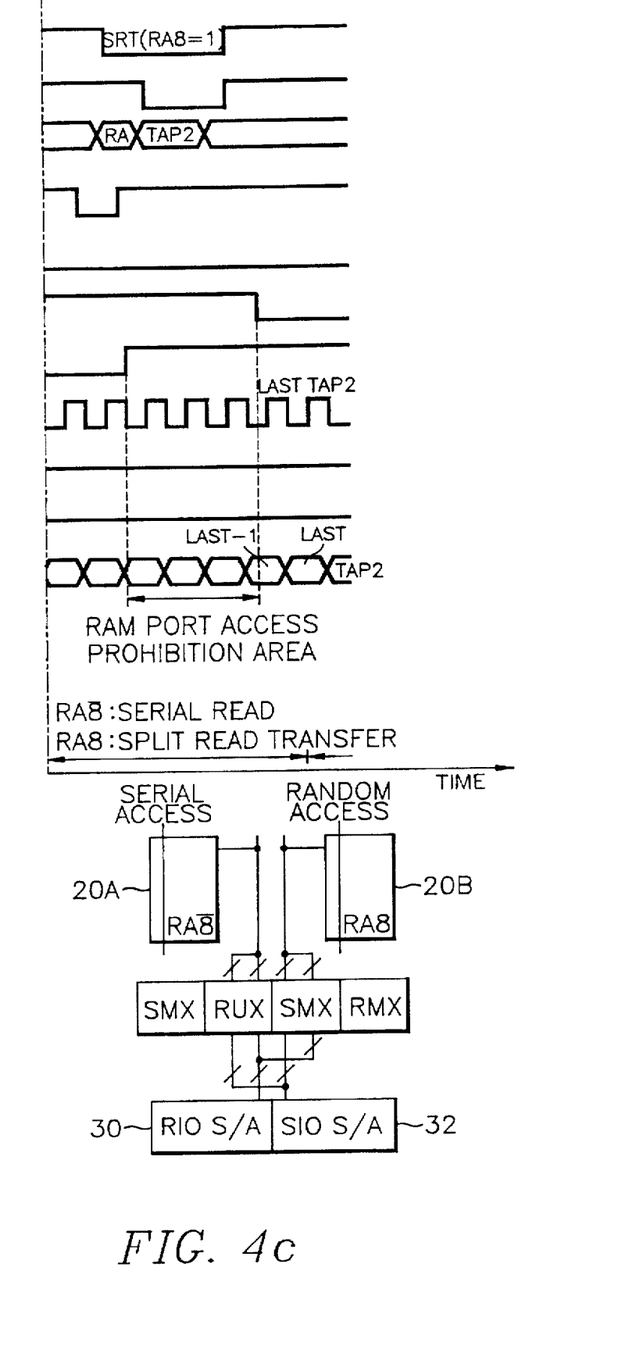

FIGS. 4A–4C form is a timing diagram showing the operation of the graphic RAM according to the present invention. FIG. 4a shows the step of enabling a specific word line for the serial access operation and thereby performing a read transfer operation.

Figure 5A:
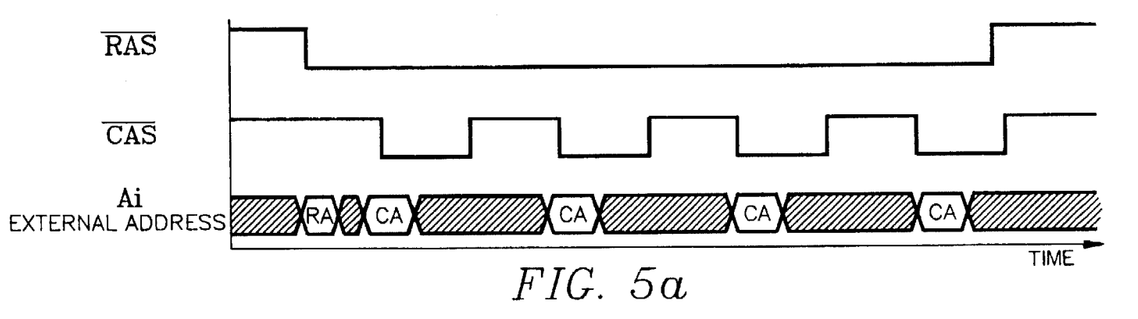
FIG. 5 is a timing diagram in a general fast page mode and in a serial access mode according to the present invention.
Figure 5B:
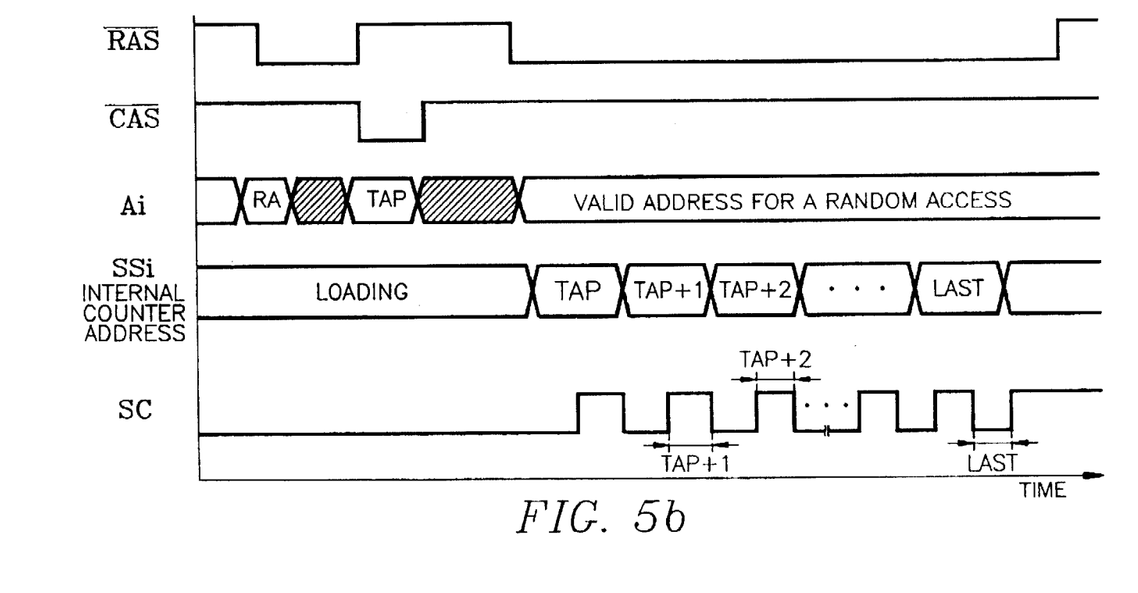
Figure 6:
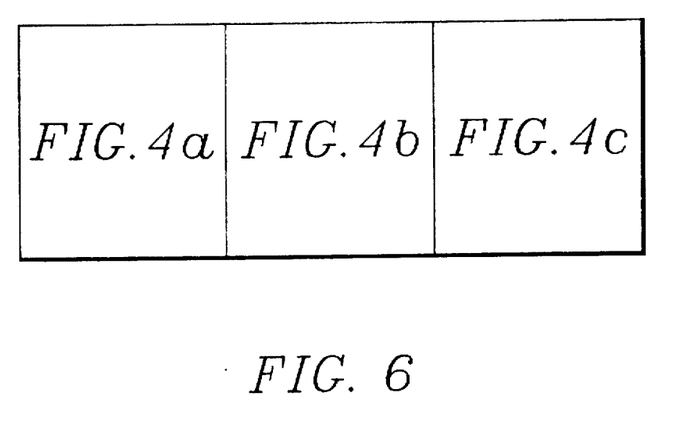
FIG. 6 is a diagram showing a construction of FIG. 4.

The column address designates a start address to perform a serial access operation. The start address is loaded on the internal serial counter and then is synchronized with the serial clock SC, to be sequentially increased. Thereby, the serial access operation is performed. The method for performing the serial access operation is similar to a general fast page mode cycle. However, as known in the art, during each $\overline{CAS}$ cycle in the fast page mode, another valid column address is input via an address PIN. FIG. 5a shows a timing diagram in the general fast page mode cycle. In the method for accessing serial data according to the present invention, the column address is loaded on the internal serial counter at the read transfer operation and is synchronized with the serial clock SC, thereby generating an address corresponding to the address to be accessed. FIG. 5b shows the timing diagram according to the method for accessing the serial data of the present invention.

FIG. 4b shows the step of performing the serial read from the RAM array 20A and the random access operation from the RAM array 20B. FIG. 4c shows the step of performing the serial read from the RAM array 20A and the split read transfer operation from the RAM array 20B.

As described above, the graphic RAM according to the present invention does not have a separate data register for outputting serial data and thus outputs the serial data only from the RAM array. Accordingly, only the RAM array is formed in the cell core region, thereby reducing the size and price of the chip. In addition, it is possible to be compatible with the system having a conventional video RAM controller.

What is claimed is:

1. A graphic RAM for outputting display data to a display device in response to control of a system, said graphic RAM comprising:

RAM arrays including a plurality of sub blocks, each sharing random and serial output paths and connected to said random and serial output paths in a registerless manner, thereby enabling random access to said random output path of one RAM array while a specific sub block of the other RAM array is performing a display operation to said display device via said serial output path without requiring a data register.

2. The graphic RAM according to claim 1, wherein said graphic RAM comprises a single operation mode of serial access enabling selection of all columns in a corresponding row by one row enable signal.

3. A graphic RAM for outputting display data to a display device in response to control of a system, said graphic RAM comprising:

a first RAM array including a plurality of memory cells;

a second RAM array including a plurality of memory cells;

first RAM transfer means for accessing data of said first RAM array to said system;

first serial transfer means connected to said first RAM array in a registerless manner, for outputting the data of said first RAM array as said display data;

second RAM transfer means for accessing data of said second RAM array to said system; and second serial transfer means connected to said second RAM array in a registerless manner, for outputting the data of said second RAM array as said display data, thereby selectively outputting respective data of said first and second RAM arrays to said system and display device without requiring a data resister.

4. The graphic RAM according to claim 3, wherein said graphic RAM comprises a single operation mode of serial access enabling selection of all columns in a corresponding row by one row enable signal.

5. A graphic RAM for outputting display data to a display device in response to control of a system, said graphic RAM comprising:

a first RAM array;

a second RAM array;

a first data I/O line connected to said first RAM array;

a second data I/O line connected to said second RAM array;

a first RAM multiplexer connected to said first data I/O line;

a first serial multiplexer connected to said first data I/O line in a registerless manner;

a second RAM multiplexer connected to said second data I/O line; and a second serial multiplexer connected to said second data I/O line in a registerless manner, wherein said second RAM array outputs said display data if said first RAM array accesses the data to said system.

6. The graphic RAM according to claim 5, wherein said graphic RAM comprises a single operation mode of serial access enabling selection of all columns in a corresponding row by one row enable signal.

7. A graphic RAM for outputting display data to a display device in response to control of a system, said graphic RAM comprising:

a RAM array including a plurality of memory cells;

a word line for selecting the row of said RAM array;

a bit line for selecting the column of said RAM array and then transferring the data of said memory cell;

a bit line sense amplifier for amplifying data read out from said RAM array via said bit line;

a common I/O line;

a first path formed between said bit line sense amplifier and said common I/O line, for forming a current path during a random access operation;

a second path formed in a registerless manner between said bit line sense amplifier and said common I/O line, for forming a current path during a serial access operation;

a random access multiplexer for multiplexing the data transferred to said common I/O line via said first path; and a serial access multiplexer for multiplexing the data transferred to said common I/O line via said second path.

8. The graphic RAM according to claim 7, wherein said graphic RAM comprises a single operation mode of serial access enabling selection of all columns in a corresponding row by one row enable signal.

9. A method for accessing serial data of a graphic RAM which outputs display data to a display device in response to control of a system, said graphic RAM comprising RAM arrays including a plurality of sub blocks, each sharing random and serial output paths and connected to said random and serial output paths in a registerless manner, said method comprising the step of:

enabling a random access to said random output path of one RAM array while a specific sub block of the other RAM array is performing a display operation to said display device via said serial output path in a registerless manner.

10. The method according to claim 9, wherein said graphic RAM comprises a single operation mode of serial access enabling selection of all columns in a corresponding row by one row enable signal.

11. A method for accessing serial data of a graphic RAM which outputs display data to a display device in response to control of a system, said graphic RAM comprising a first RAM array including a plurality of memory cells, a second RAM array including a plurality of memory cells, a first RAM transfer means for accessing data of said first RAM array to said system, a first serial transfer means connected to said first RAM array in a registerless manner, for outputting the data of said first RAM array as display data, a second RAM transfer means for accessing data of said second RAM array to said system, and a second serial transfer means connected to said second RAM array in a registerless manner, for outputting the data of said second RAM array as display data, said method comprising the step of:

selectively outputting respective data of said first and second RAM arrays to said system and, in a registerless manner, to said display device.

12. The method according to claim 11, wherein said graphic RAM comprises a single operation mode of serial access enabling selection of all columns in a corresponding row by one row enable signal.

13. A method for accessing serial data of a graphic RAM which outputs display data to a display device in response to control of a system, said graphic RAM comprising a first RAM array, a second RAM array, a first data I/O line connected to said first RAM array, a second data I/O line connected to said second RAM array, a first RAM multiplexer connected to said first data I/O line, a first serial multiplexer connected to said first data I/O line in a registerless manner, a second RAM multiplexer connected to said second data I/O line, and a second serial multiplexer connected to said second data I/O line in a registerless manner, said method comprising the step of:

outputting said display data from said second RAM array in a registerless manner if said first RAM array accesses said display data to said system.

14. The method according to claim 13, wherein said graphic RAM comprises a single operation mode of serial access enabling selection of all columns in a corresponding row by one row enable signal.

15. A method for accessing serial data of a graphic RAM which outputs display data to a display device in response to control of a system, wherein said graphic RAM comprises a RAM array including a plurality of memory cells, said method comprising the steps of:

selecting a column of said RAM array via a word line, selecting a row of said RAM array via a bit line;

transferring data of a memory cell defined by said row and column;

amplifying, via a bit sense amp, data read out from said RAM array via said bit line;

forming a first current path between said bit line sense amp and a common I/O line during a random access;

forming a second current path in a registerless manner between said bit line sense amp and said common I/O line during a serial access;

multiplexing RAM data transferred to said first current path and then to said common I/O line; and multiplexing serial data transferred to said second path and then to said common I/O line.

16. The method according to claim 15, wherein said graphic RAM comprises a single operation mode of serial access enabling selection of all columns in a corresponding row by one row enable signal.

* * * * *